(12) United States Patent
Toyoguchi et al.

(10) Patent No.: US 9,124,833 B2
(45) Date of Patent: Sep. 1, 2015

(54) SOLID-STATE IMAGING APPARATUS

(71) Applicant: CANON KABUSHIKI KAISHA, Tokyo (JP)

(72) Inventors: Ginjiro Toyoguchi, Tokyo (JP); Shin Kikuchi, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 203 days.

(21) Appl. No.: 13/961,986

(22) Filed: Aug. 8, 2013

(65) Prior Publication Data

US 2014/0078354 A1    Mar. 20, 2014

(30) Foreign Application Priority Data

Sep. 14, 2012 (JP) ................................. 2012-203537
May 13, 2013 (JP) ................................. 2013-101712

(51) Int. Cl.
| | | |
|---|---|---|
| *H04N 5/374* | (2011.01) | |
| *H04N 5/357* | (2011.01) | |
| *H04N 5/361* | (2011.01) | |
| *H04N 5/365* | (2011.01) | |
| *H01L 27/146* | (2006.01) | |
| *H04N 5/369* | (2011.01) | |
| *H04N 5/359* | (2011.01) | |

(52) U.S. Cl.
CPC .......... *H04N 5/374* (2013.01); *H01L 27/14603* (2013.01); *H01L 27/14643* (2013.01); *H04N 5/3575* (2013.01); *H04N 5/361* (2013.01); *H04N 5/3658* (2013.01); *H04N 5/3696* (2013.01); *H01L 27/14609* (2013.01); *H04N 5/359* (2013.01)

(58) Field of Classification Search
None
See application file for complete search history.

(56) References Cited

U.S. PATENT DOCUMENTS

| | | | | |
|---|---|---|---|---|
| 2008/0258047 | A1* | 10/2008 | Sakakibara et al. | 250/214 C |
| 2009/0190017 | A1* | 7/2009 | Ono | 348/308 |
| 2010/0231761 | A1* | 9/2010 | Yanai | 348/243 |
| 2011/0013052 | A1* | 1/2011 | Yanai | 348/243 |
| 2011/0080492 | A1* | 4/2011 | Matsuda et al. | 348/222.1 |

FOREIGN PATENT DOCUMENTS

JP    2008-271280    11/2008

* cited by examiner

*Primary Examiner* — Justin P Misleh
(74) *Attorney, Agent, or Firm* — Fitzpatrick, Cella, Harper & Scinto

(57) ABSTRACT

A solid-state imaging apparatus includes a pixel array, an effective signal line, a dummy pixel, a dummy signal line, and a processing unit. The effective pixels in the pixel array include a photoelectric converter, a charge-voltage converter, and an output unit. The dummy pixel includes a charge-voltage that has the same configuration as the charge-voltage converter of the effective pixel, and an output unit. A shortest distance between the charge-voltage converter of the dummy pixel and the effective signal line is longer than a shortest distance between the charge-voltage converter of the dummy pixel and the dummy signal line.

18 Claims, 8 Drawing Sheets

F I G. 1
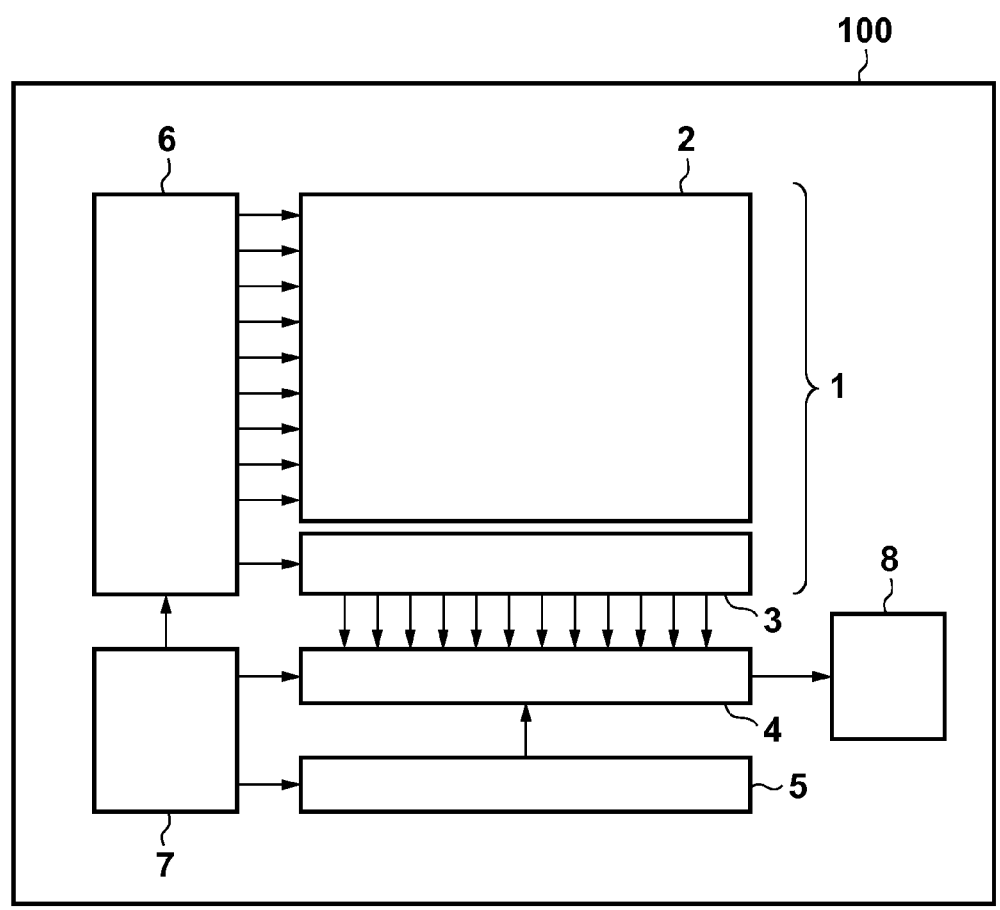

SOLID-STATE IMAGING APPARATUS

BACKGROUND OF THE INVENTION

1. Field of the Invention

The present invention relates to a solid-state imaging apparatus.

2. Description of the Related Art

A solid-state imaging apparatus has been proposed that has a pixel array including pixels arranged in an array, reads out pixel signals obtained by the pixels in the pixel array from each column, and processes the signals from each column with a CDS circuit or the like to convert them into image signals. With this solid-state imaging apparatus, fixed-pattern noise in a vertical-line shape occurs in some cases due to variation of output signals among columns or among output signal paths. Japanese Patent Laid-Open No. 2008-271280 proposes a configuration in which the vertical-line noise is corrected using, as data for vertical-line noise correction, output signals of dummy pixels having characteristics equivalent to effective pixels. With this configuration, the vertical-line noise can be effectively corrected by obtaining a difference between signals that are output simultaneously from an effective pixel and a dummy pixel.

Also, in recent solid-state imaging apparatuses, the size of layouts has been reduced due to the increasing number of pixels and readout lines. For this reason, regarding readout circuits arranged in each column, there is a tendency that the distance within circuits in adjacent columns and the distance between adjacent readout circuits become shorter, along with the reduction in size. As a result, signal interference is more likely to occur among the readout circuits, and this interference causes noise. In particular, with the configuration in which dummy pixels are used to obtain reference data, the distance between an effective pixel and a dummy pixel is significantly shortened, and therefore, crosstalk occurs between the effective pixel and the dummy pixel and affects the characteristics of the data used as the reference data.

SUMMARY OF THE INVENTION

As mentioned above, Japanese Patent Laid-Open No. 2008-271280 proposes a solid-state imaging apparatus that obtains a difference between a signal from an effective pixel and a signal from a dummy pixel and outputs an image signal. However, it does not contain any proposal regarding a specific layout for reducing interference such as crosstalk between an effective pixel and a dummy pixel. Therefore, some aspects of the present invention provide a layout that reduces interference between an effective pixel and a dummy pixel in a solid-state imaging apparatus having the effective pixel and the dummy pixel.

In some embodiments, a solid-state imaging apparatus includes a pixel array having a plurality of effective pixels arranged in an array, an effective signal line to which a signal of a plurality of effective pixels aligned in a first direction is output, a dummy pixel provided with respect to the plurality of effective pixels aligned in the first direction, a dummy signal line to which a signal of the dummy pixel is output, and a processing unit configured to correct the signal from the effective signal line, based on the signal from the dummy signal line. The effective pixels include a photoelectric converter, a charge-voltage converter configured to convert a charge generated in the photoelectric converter into voltage, and an output unit configured to output a signal corresponding to the voltage of the charge-voltage converter, to the effective signal line. The dummy pixel includes a charge-voltage converter that has the same configuration as the charge-voltage converter of the effective pixel, and an output unit configured to output a signal corresponding to voltage of the charge-voltage converter of the dummy pixel, to the dummy signal line. A shortest distance between the charge-voltage converter of the dummy pixel and the effective signal line is longer than a shortest distance between the charge-voltage converter of the dummy pixel and the dummy signal line.

In some other embodiments, a solid-state imaging apparatus includes a pixel array having a plurality of effective pixels arranged in an array, an effective signal line to which a signal of a plurality of effective pixels aligned in a first direction is output, a dummy pixel provided with respect to the plurality of effective pixels aligned in the first direction, a dummy signal line to which a signal of the dummy pixel is output, and a processing unit configured to correct the signal from the effective signal line, based on the signal from the dummy signal line. The effective pixels include a photoelectric converter, a charge-voltage converter configured to convert a charge generated in the photoelectric converter into voltage, and an output unit configured to output a signal corresponding to the voltage of the charge-voltage converter, to the effective signal line. The dummy pixel includes a charge-voltage converter and an output unit configured to output a signal corresponding to voltage of the charge-voltage converter of the dummy pixel, to the dummy signal line. The charge-voltage converter of the dummy pixel includes a floating diffusion and a conductor electrically connected to the floating diffusion. A shortest distance between the charge-voltage converter of the dummy pixel and the effective signal line is longer than a shortest distance between the charge-voltage converter of the dummy pixel and the dummy signal line.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate an embodiment of the invention, and together with the description, serve to explain the principles of the embodiment.

FIG. 1 is a block diagram of a solid-state imaging apparatus of some embodiments of the present invention.

DESCRIPTION OF THE EMBODIMENTS

Figure 2:
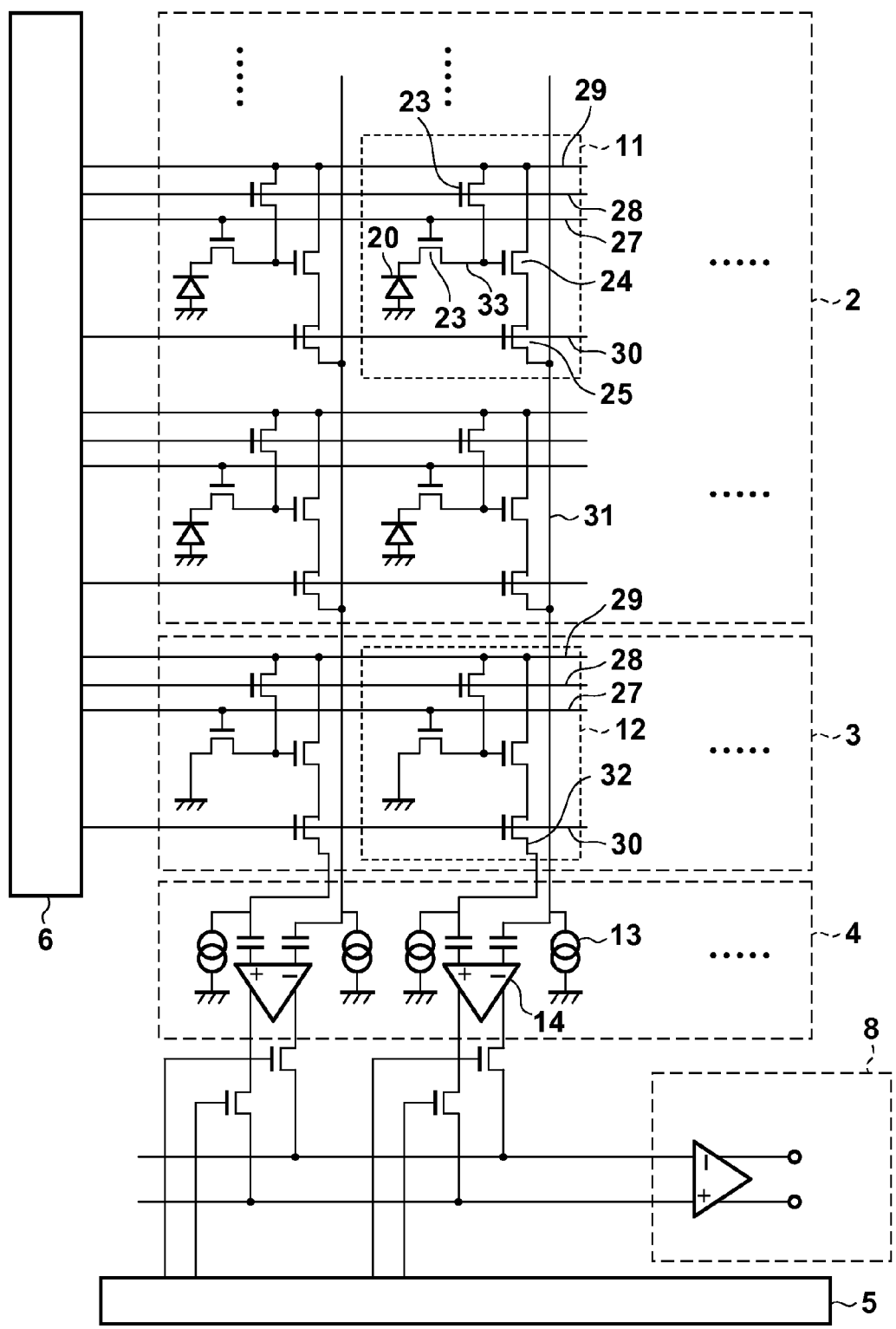
FIG. 2 is a diagram showing a specific circuit configuration of part of a solid-state imaging apparatus of some embodiments of the present invention.

Some embodiments of the present invention will be described below with reference to the accompanying drawings. Similar elements will be given the same reference numerals throughout the embodiments, and redundant descriptions will be omitted. Also, the embodiments can be changed or combined as needed.

FIG. 1 is an exemplary block diagram of a solid-state imaging apparatus 100 according to some embodiments of the present invention. The solid-state imaging apparatus 100 may be a CMOS image sensor, for example. The solid-state imaging apparatus 100 may include a pixel unit 1, a pixel signal processing unit 4, a horizontal scanning circuit 5, a vertical scanning circuit 6, a timing control circuit 7, and an output circuit 8. The pixel unit 1 may include a pixel array 2 having a plurality of effective pixels arranged in an array, and a dummy pixel unit 3 having a plurality of dummy pixels arranged in a row. The dummy pixel unit 3 is arranged outside the pixel array 2, and is arranged along one side of the pixel array 2 in the example in FIG. 1.

Each effective pixel included in the pixel array 2 outputs a signal for determining a pixel value of the corresponding effective pixel to the pixel signal processing unit 4. Hereinafter, the signal output from an effective pixel will be referred to as an effective signal. Each dummy pixel included in the dummy pixel unit 3 outputs a signal for correcting noise in the signal obtained at an effective pixel to the pixel signal processing unit 4. Hereinafter, the signal output from a dummy pixel will be referred to as a noise signal. The pixel signal processing unit 4 obtains and outputs a difference between the effective signal and the noise signal. Hereinafter, the signal output from the pixel signal processing unit 4 will be referred to as a pixel signal.

The vertical scanning circuit 6 is constituted by, for example, a shift register, an address decoder, or the like, and reads out the effective signals of the pixels in each row by scanning the effective pixels within the pixel array 2 in units of rows in the vertical direction (up-down direction in FIG. 1). The horizontal scanning circuit 5 is constituted by, for example, a shift register, an address decoder, or the like, and sequentially scans the pixel signals that are output from the pixel signal processing unit 4, in the horizontal direction (left-right direction in FIG. 1).

The output circuit 8 outputs the pixel signals from the horizontal scanning circuit 5 to the outside. The output circuit 8 may output the pixel signal that is output from the pixel signal processing unit 4, as an analog signal. Alternatively, in the case where the solid-state imaging apparatus 100 includes a column circuit having an AD (analog-digital) conversion function, the output circuit 8 may output the pixel signal that is output from the pixel signal processing unit 4, as a digital signal. The timing control circuit 7 supplies timing signals and control signals, which are used as references for operation, to the vertical scanning circuit 6 and the horizontal scanning circuit 5, to control the operation of the solid-state imaging apparatus 100.

FIG. 2 is a diagram illustrating an example of specific circuitry of the pixel array 2, the dummy pixel unit 3, the pixel signal processing unit 4, and the output circuit 8 in the solid-state imaging apparatus 100. The effective pixels 11 are arranged in an array in the pixel array 2. An effective signal line 31 to which all pixels in a pixel column are connected is provided in each pixel column (a set of the effective pixels 11 aligned in a first direction, i.e., in an up-down direction in FIG. 2). The effective signals from the effective pixels 11 are output to the effective signal lines 31 and supplied to the pixel signal processing unit 4. Also, a power supply line 29 and a drive control line are provided for each pixel row (a set of the effective pixels 11 aligned in a second direction, i.e., in a left-right direction in FIG. 2). Hereinafter, the first direction and the second direction will be referred to as a column direction and a row direction, respectively, for the sake of convenience. The first direction and the second direction need only be different directions, and may be orthogonal directions. In the example in FIG. 2, the drive control line includes a transfer control line 27, a reset control line 28, and a selection control line 30.

In the dummy pixel unit 3, the dummy pixels 12 are arranged in the row direction, and one dummy pixel 12 is arranged for each column of the effective pixels 11. The dummy pixels 12 may have the same characteristics as the effective pixels 11. A dummy signal line 32 is provided for each dummy pixel 12. The noise signals from the dummy pixels 12 are output to the dummy signal lines 32 and supplied to the pixel signal processing unit 4. Also, a power supply line 29 and a drive control line are provided in the row of the dummy pixels 12. As with the drive control line provided for the effective pixels 11, the drive control line provided for the dummy pixel 12 also includes a transfer control line 27, a reset control line 28, and a selection control line 30.

The pixel signal processing unit 4 is provided with a differential amplifier circuit 14 for each pixel column, that is, for each effective signal line 31. The effective signal line 31 is connected to an inverting input terminal of the differential amplifier circuit 14, and the effective signal is supplied to the inverting input terminal. A non-inverting input terminal of the differential amplifier circuit 14 is connected to the dummy signal line 32, which is connected to the dummy pixel 12 corresponding to this pixel column, and the noise signal is supplied to the non-inverting input terminal. The effective signal lines 31 and the dummy signal line 32 are grounded via a current source transistor 13. The differential amplifier circuit 14 amplifies the difference between the effective signals and the noise signals, and outputs them as the pixel signals. The pixel signals may be output from two output terminals as shown in FIG. 2, or may be output from one output terminal.

The pixel signal processing unit 4 may have a correlative double sampling circuit (CDS circuit) for performing processing for obtaining the difference between the effective signals and the noise signals. Generally, the pixel signal processing unit 4 may have any kind of configuration as long as it can output the pixel signals based on the difference between the effective signals and the noise signals.

Figure 3:
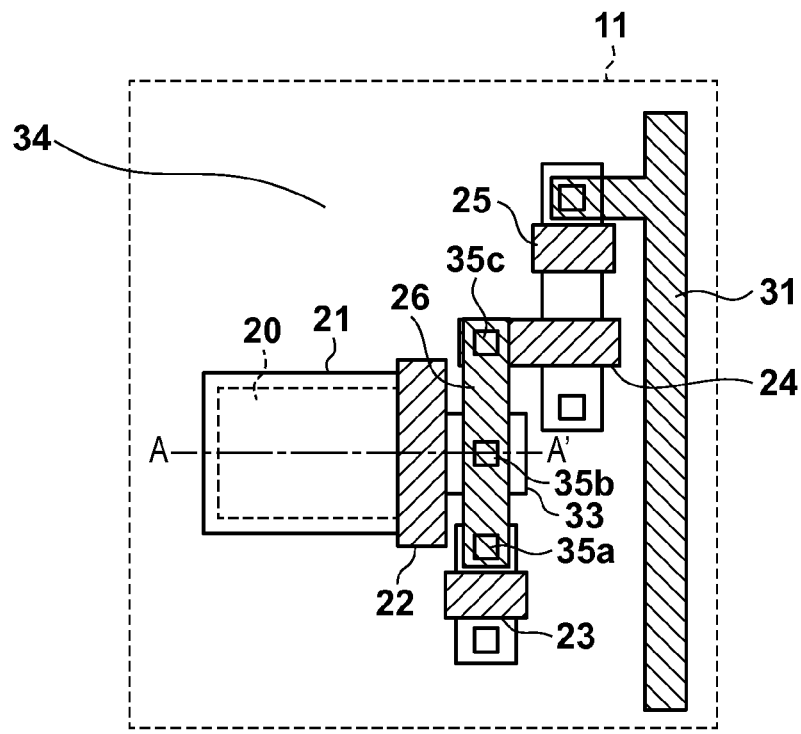
FIG. 3 is a diagram showing a specific layout of an effective pixel of some embodiments of the present invention.
Figure 4:
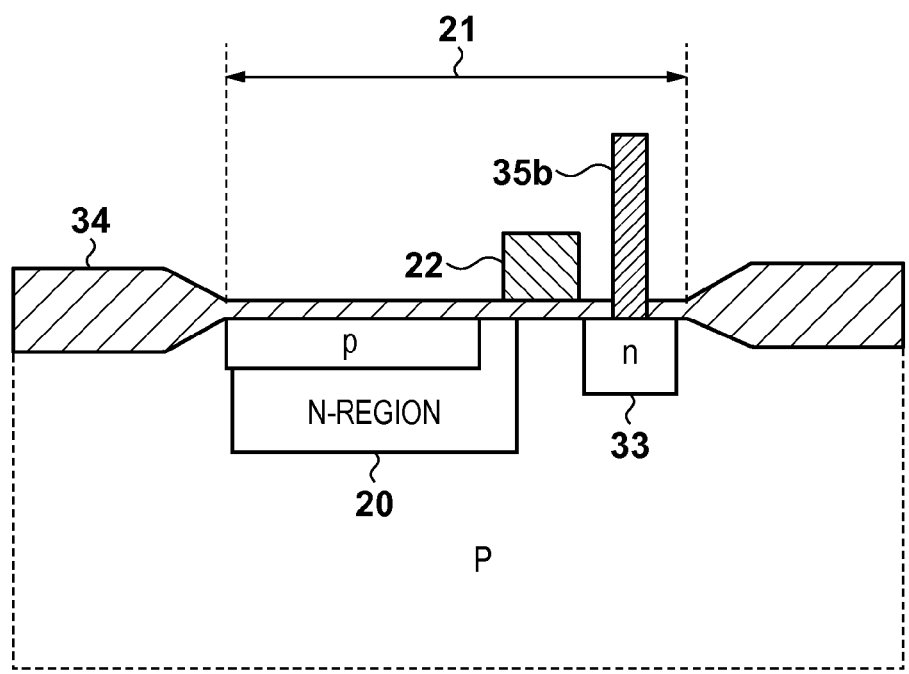
FIG. 4 is a cross-sectional view taken along line A-A' in FIG. 3.

FIG. 3 is a diagram illustrating an example of a specific layout of one of the effective pixels 11 in the solid-state imaging apparatus 100 shown in FIG. 2, and FIG. 4 is a cross-sectional view taken along line A-A' in FIG. 3. The effective pixel 11 may have a photoelectric conversion element 20, a transfer transistor 22, a reset transistor 23, an amplification transistor 24, a selection transistor 25, and a floating diffusion 33. The photoelectric conversion element 20 and the floating diffusion 33 may be formed in an active region 21. These circuit elements are formed in the active region 21, and an element isolation region 34 is formed around the active region 21. Although the aforementioned transistors are, for example, N-channel MOS transistors in the following example, they may be P-channel MOS transistors, or may be another kind of transistor.

The photoelectric conversion element 20 is a photoelectric converter for generating charges corresponding to incident light, and is constituted by a photodiode, for example. One end of the photoelectric conversion element 20 is grounded, and the other end thereof is connected to the floating diffusion 33 via the transfer transistor 22. The floating diffusion 33 is a semiconductor region in which charges can be accumulated, and its potential may be in a floating state. The transfer transistor 22 becomes conductive upon a transfer signal being supplied to its gate electrode through the transfer control line 27.

The reset transistor 23 has a drain electrode connected to the power supply line 29, a source electrode connected to the floating diffusion 33, and a gate electrode connected to the reset control line 28. More specifically, the drain electrode of the reset transistor 23 is connected to an electrically conductive pattern 26 by a plug 35a, such as a contact plug or a via plug, and the floating diffusion 33 is connected to the electrically conductive pattern 26 with a plug 35b. Thus, the floating diffusion 33 is electrically connected to the source electrode of the reset transistor 23 through the plug 35a, the electrically conductive pattern 26, and the plug 35b. The reset transistor 23 becomes conductive upon a reset signal being supplied to its gate electrode through the reset control line 28.

The amplification transistor 24 has a gate electrode that is electrically connected to the floating diffusion 33, a drain electrode that is connected to the power supply line 29, and a source electrode connected to the selection transistor 25. Specifically, the gate electrode of the amplification transistor 24 is connected to the electrically conductive pattern 26 by a plug 35c. Thus, the floating diffusion 33 is electrically connected to the gate electrode of the amplification transistor 24 through the plug 35c, the electrically conductive pattern 26, and the plug 35b. The amplification transistor 24 functions as a source follower.

The selection transistor 25 has a gate electrode connected to the selection control line 30, a source electrode connected to the effective signal line 31, and a drain electrode connected to the amplification transistor 24. Although the selection transistor 25 is connected between the source electrode of the amplification transistor 24 and the effective signal line 31 in the example in FIG. 3, it may alternatively be connected between the drain electrode of the amplification transistor 24 and the power supply line 29. The selection transistor 25 becomes conductive upon a transfer signal being supplied to its gate electrode through the selection control line 30. The amplification transistor 24 and the selection transistor 25 constitute an output unit for outputting a signal corresponding to a potential of the floating diffusion 33, to the effective signal line 31.

Figure 5:
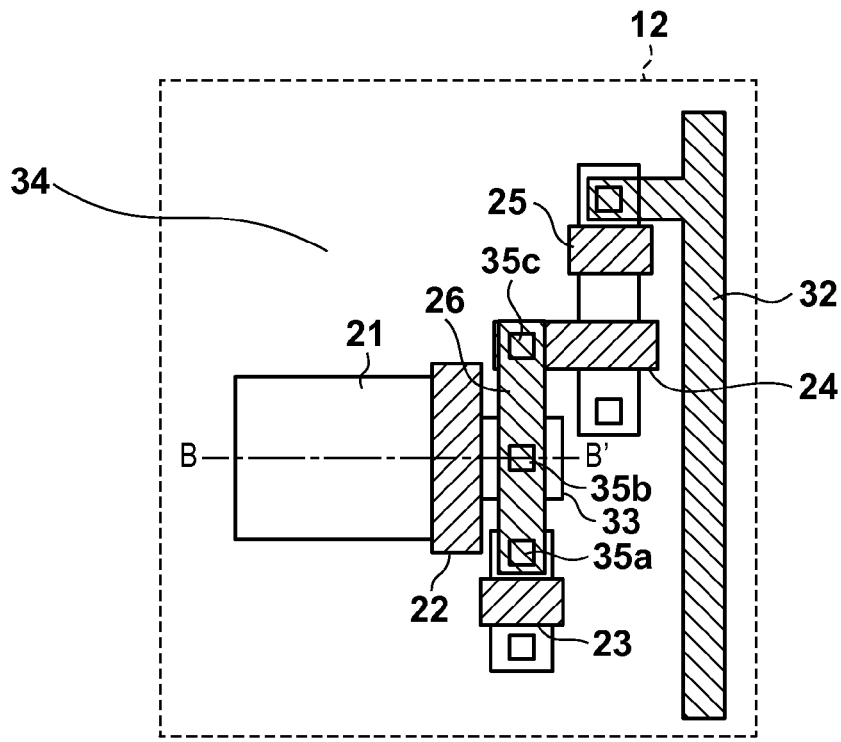
FIG. 5 is a diagram showing a specific layout of a dummy pixel of some embodiments of the present invention.
Figure 6:
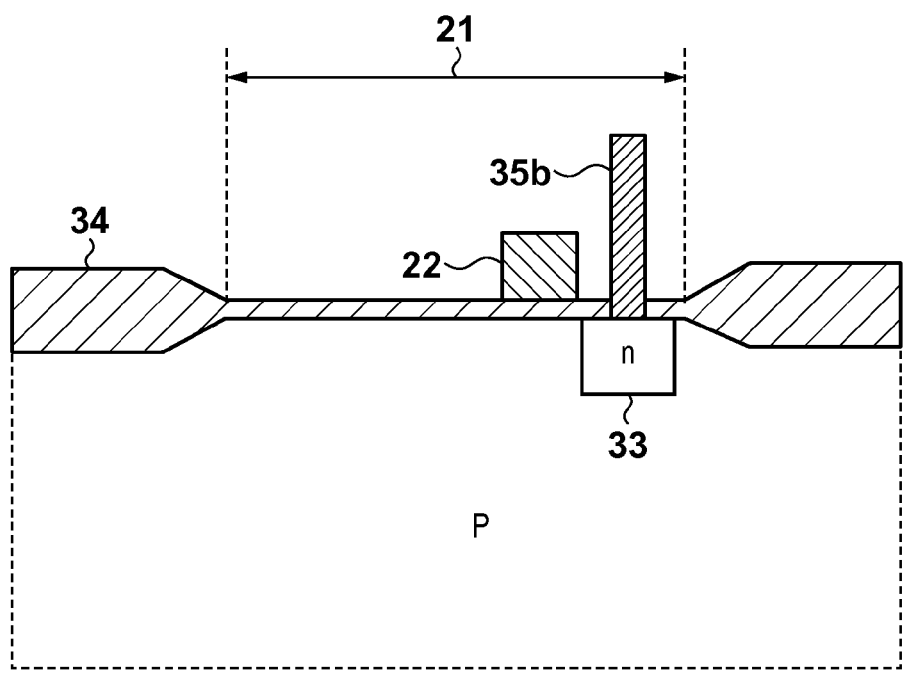
FIG. 6 is a cross-sectional view taken along line B-B' in FIG. 5.

FIG. 5 is a diagram illustrating an example of a specific layout of each dummy pixel 12 in the solid-state imaging apparatus 100 shown in FIG. 2, and FIG. 6 is a cross-sectional view taken along line B-B' in FIG. 5. The effective pixel 11 and the dummy pixel 12 are different in that the dummy pixel 12 does not have the photoelectric conversion element 20 in the active region 21, and in that the source electrode of the selection transistor 25 of the dummy pixel 12 is connected not to the effective signal line 31, but to the dummy signal line 32. The dummy pixel 12 may have a configuration similar to the effective pixel 11 in other respects. Since the dummy pixel 12 does not have the photoelectric conversion element 20, the dummy pixel 12 is not affected by incident light and can output a more appropriate noise signal. The dummy pixel 12 may be formed such that the form of each circuit element of the dummy pixel 12 matches the shape of the corresponding circuit element of the effective pixel 11. Thus, the capability of the dummy pixel 12 to reproduce noise in the effective pixel 11 is improved. Alternatively, the capability to reproduce noise may be improved by forming the dummy pixel 12 such that the circuit element of the dummy pixel 12 is oriented in the same direction as the corresponding circuit element of the effective pixel. Furthermore, the characteristics of the dummy pixel 12 can be made equivalent to the characteristics of the effective pixel 11 by forming the dummy pixel 12 and the effective pixel 11 through the same process, resulting in an improvement in the capability to reproduce noise. However, in the case where the dummy pixel and the effective pixel have photoelectric conversion elements with different structures, as will be described later, the transfer transistor 22 of the dummy pixel substantially does not have the area corresponding to the source electrode. In this case, it can be said that the dummy pixel has a transfer gate that is similar to a transfer transistor.

In the effective pixel 11 and the dummy pixel 12, the portion constituted by the floating diffusion 33 and a conductor that is electrically connected to the floating diffusion 33 is called a charge-voltage converter. Every part of the charge-voltage converter may be deemed to be at substantially the same potential. The amplification transistor 24 amplifies a signal based on the voltage of the charge-voltage converter and outputs it as the image signal or the noise signal. In the configuration shown in FIG. 3, the charge-voltage converter is constituted by the floating diffusion 33, the source electrode of the reset transistor 23, the gate electrode of the amplification transistor 24, the electrically conductive pattern 26, and the plugs 35a, 35b, and 35c.

Subsequently, an exemplary operation of the solid-state imaging apparatus 100 will be briefly described. The solid-state imaging apparatus 100 may operate in any way, for example, using an existing method, as long as the pixel signal processing unit 4 corrects the effective signal from the effective signal line 31 using the noise signal from the dummy signal line 32. An operation in the case of reading out a signal from one pixel row of the pixel array 2 will be described below. This operation is sequentially performed with respect to all pixel rows. The vertical scanning circuit 6 switches the transfer transistor 22 into a non-conductive state in each effective pixel 11 included in one pixel row in the pixel array 2 and each dummy pixel 12 included in the dummy pixel unit 3, and starts accumulating charges. In this case, charges are not accumulated in the dummy pixels 12 that do not have the photoelectric conversion elements 20. After the elapse of a fixed period of time (accumulation period), the vertical scanning circuit 6 switches the reset transistor 23 to a conductive state. Thus, the potential of the charge-voltage converter is reset to the potential of the power supply line 29 in the effective pixel 11 and the dummy pixel 12.

Thereafter, the vertical scanning circuit 6 switches the selection transistor 25 to a conductive state in the effective pixels 11 and the dummy pixels 12 and outputs signals at a reset level to the effective signal line 31 and the dummy signal line 32 in accordance with the potential of the charge-voltage converter. The horizontal scanning circuit 5 sequentially reads out the outputs from the pixel signal processing unit 4 and outputs them to the output circuit 8. Next, the horizontal scanning circuit 5 switches the reset transistor 23 and the selection transistor 25 to a non-conductive state in the effective pixel 11 and the dummy pixel 12. Thereafter, the vertical scanning circuit 6 switches the transfer transistor 22 to a conductive state in the effective pixel 11 and the dummy pixel 12. Thereafter, the vertical scanning circuit 6 switches the selection transistor 25 to a conductive state in the effective pixel 11 and the dummy pixel 12 and outputs signals corresponding to the potential of the charge-voltage converter, to the effective signal line 31 and the dummy signal line 32. The horizontal scanning circuit 5 sequentially reads out the outputs from the pixel signal processing unit 4 and outputs them to the output circuit 8. Thus, vertical-line noise can be effectively reduced by the pixel signal processing unit 4 outputting a pixel signal based on a difference between the effective signal from the effective pixel 11 and the dummy signal from the dummy pixel 12 that are output at the same timing.

In the above-described operation, the noise signal that is output from the dummy pixel 12 is used to remove a noise component from the pixel signal that is output from the effective pixel 11. For this reason, the solid-state imaging apparatus 100 is configured such that the noise signal is not affected by incident light. In the above-described example, the influence of incident light is suppressed by not forming the photoelectric conversion element 20 in the dummy pixel 12. In the example where the photoelectric conversion element 20 is formed in the dummy pixel 12, the solid-state imaging apparatus 100 may have a shielding layer for shielding the dummy pixel unit 3 from light. Alternatively, the impurity concentration in the semiconductor region that constitutes the photoelectric conversion element 20 of the dummy pixel 12 may be adjusted such that charges are not accumulated in the photoelectric conversion element 20.

Specifically, in the case where the photoelectric conversion element of the effective pixel accumulates electrons, the area of an N-type semiconductor region disposed in the active region of the dummy pixel corresponding to the active region in which the photoelectric conversion element of the effective pixel is disposed may be reduced. Alternatively, the N-type semiconductor region does not need to be provided in the active region of the dummy pixel corresponding to the active region in which the photoelectric conversion element of the effective pixel is disposed. However, a P-type semiconductor region may be provided in the aforementioned active region of the dummy pixel as well. More generally speaking, the photoelectric conversion element of the effective pixel has a first semiconductor region having the same polarity as signal charges, and a second semiconductor region of an opposite conductivity type. The area of the semiconductor region that is disposed in the active region of the dummy pixel corresponding to the active region in which the photoelectric conversion element of the effective pixel is disposed and that has the same polarity as the first semiconductor region is smaller than the area of the first semiconductor region. Alternatively, a semiconductor region having the same polarity as the first semiconductor region is not provided in the active region of the dummy pixel corresponding to the active region in which the photoelectric conversion element of the effective pixel is disposed. Here, the active region of the dummy pixel corresponding to the active region in which the photoelectric conversion element of the effective pixel is disposed refers to an active region that overlaps the active region in which the photoelectric conversion element of the effective pixel is disposed when the effective pixel is translated toward the dummy pixel. Alternatively, the active region of the dummy pixel corresponding to the active region in which the photoelectric conversion element of the effective pixel is disposed is an active region on the side opposite to the floating diffusion relative to the transfer gate of the dummy pixel.

Alternatively, the dummy pixel 12 does not have to have the photoelectric conversion element 20, the transfer transistor 22, and the reset transistor 23. In this case, the charge-voltage converter of the dummy pixel 12 is constituted by the floating diffusion 33, the gate electrode of the amplification transistor 24, the electrically conductive pattern 26, and the plugs 35b and 35c. In the case where the dummy pixel 12 is thus configured, the noise signal corresponding to dark current noise in the effective pixel may be output, for example. As a result of the charge-voltage converter of the effective pixel 11 having the same configuration as the charge-voltage converter of the dummy pixel 12, the effective signal can be effectively corrected using the noise signal. In some embodiments, correction can be also performed in the case of having slightly different configuration. For example, the charge-voltage converter of the dummy pixel 12 need only include the floating diffusion 33 and the conductor that is electrically connected to the floating diffusion 33.

Subsequently, an exemplary method for manufacturing the solid-state imaging apparatus 100 will be described. The solid-state imaging apparatus 100 may be formed by any method, for example, by an existing method, as long as the above-described configuration can be realized. Initially, the element isolation region 34 is formed on a semiconductor substrate. Thereafter, the gate electrode of each transistor is formed using, for example, polysilicon. Then, the photoelectric conversion element 20 is formed by ion implantation, and a side wall is formed in the gate electrode. Thereafter, the source electrode and the drain electrode of the transistor, as well as the floating diffusion 33 are formed by ion implantation. Thereafter, the solid-state imaging apparatus 100 is manufactured by forming an insulating film made of a silicon oxide film, an electrically conductive pattern made of wiring material such as aluminum, and the like on this semiconductor substrate, and forming inner-layer lenses, color filters, microlenses, and the like.

The above-described dummy pixel unit 3 may have a configuration in which multiple dummy pixels 12 share the amplification transistor 24. In this case, the charge-voltage converter includes a conductor (e.g., a electrically conductive pattern and a plug connected thereto) that electrically connects the floating diffusion 33 of one dummy pixel 12 to the amplification transistor 24 arranged in another dummy pixel 12. Also, a configuration may be employed in which a switch is provided between floating diffusions of the dummy pixels 12 that share the amplification transistor 24, and addition is performed with the floating diffusions.

Hereinafter, several examples of the planar layout of the above-described solid-state imaging apparatus 100 will be described, focusing on each effective pixel 11 and dummy pixel 12. In these examples, since the dummy pixel 12 does not have the photoelectric conversion element 20, disturbance to the dummy pixel 12 caused by incident light can be reduced, and the dummy pixel 12 provides a superior reference potential for a differential circuit. In these examples, for example, a 0.45-μm wiring rule is used, and the size of each effective pixel 11 and each dummy pixel 12 is 19 μm. In these examples, the shortest distance L2 between the charge-voltage converter of the dummy pixel 12 and the effective signal line 31 is longer than the shortest distance L1 between this charge-voltage converter and the dummy signal line 32. Due to having this configuration, a parasitic capacitance value resulting from capacitive coupling between the effective signal line 31 and the charge-voltage converter of the dummy pixel 12 can be reduced, and the influence of the effective signal line 31 on the charge-voltage converter of the dummy pixel 12 can be reduced. As a result, the noise signal from the dummy pixel 12 can provide an output that is more ideal as a reference potential of the differential circuit.

Figure 7:
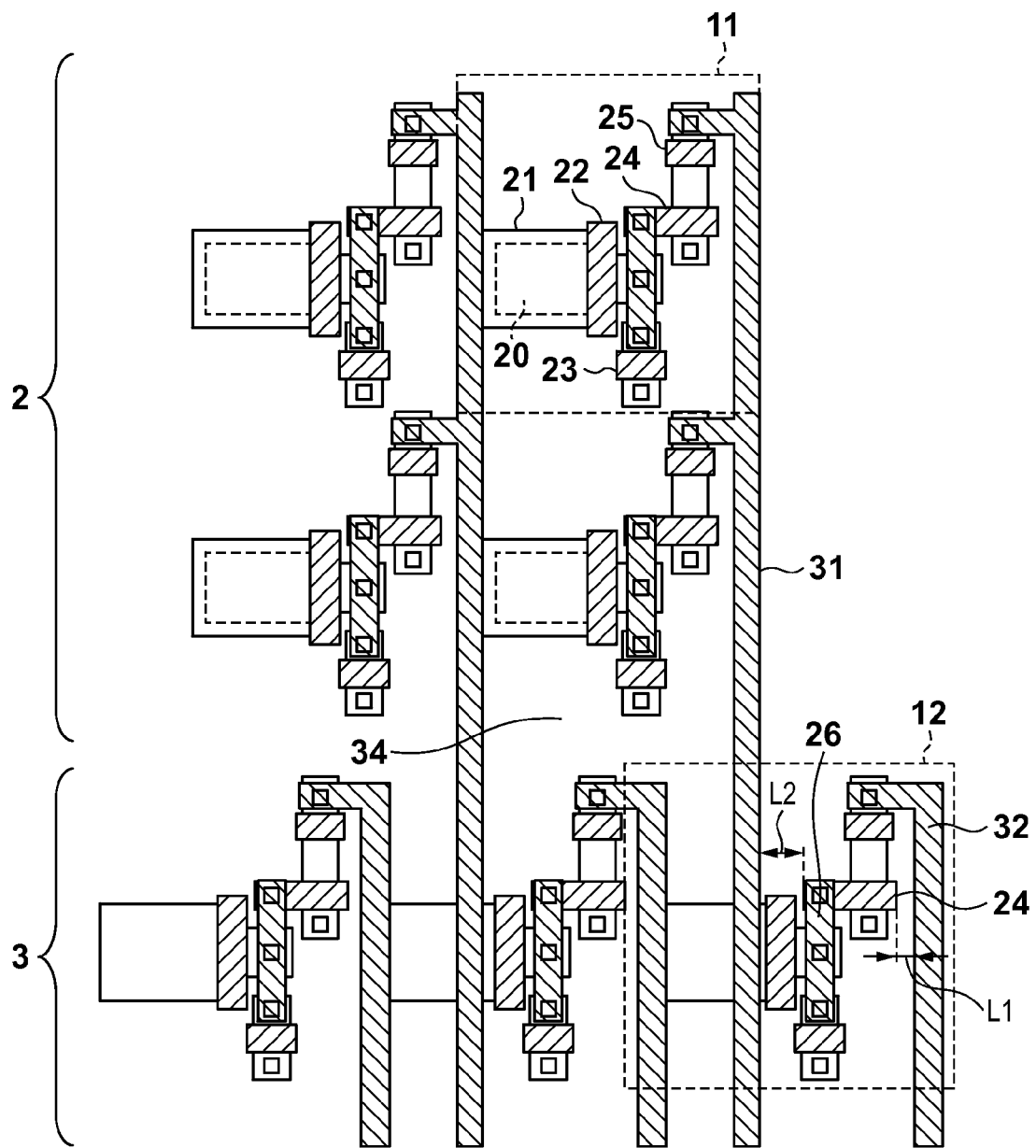
FIG. 7 is a diagram showing a planar layout of a solid-state imaging apparatus according to an example of the present invention.

FIG. 7 is a diagram illustrating a planar layout of the solid-state imaging apparatus 100 according to a first example. The effective pixel 11 and the dummy pixel 12 have equivalent configurations. For example, the effective signal line 31 is arranged on the right of the selection transistor 25 of the effective pixel 11, and similarly, the dummy signal line 32 is arranged on the right of the selection transistor 25 of the dummy pixel 12. The effective signal line 31 and the dummy signal line 32 extend straight in the column direction toward the pixel signal processing unit 4.

The dummy pixel 12 is arranged so as to be shifted rightward from the corresponding pixel column by, for example, 9.5 μm, which is equal to a half-pitch, and the effective signal lines 31 and the dummy signal lines 32 are arranged alternatingly. By thus shifting the arrangement, the shortest distance L1 between the charge-voltage converter of the dummy pixel 12 and the dummy signal line 32 is shorter than the shortest distance L2 between this charge-voltage converter and the effective signal line 31. In the example in FIG. 7, the shortest distance L1 between the charge-voltage converter of the dummy pixel 12 and the dummy signal line 32 is 0.3 μm, which is equal to the shortest distance between the gate electrode of the amplification transistor 24 of the dummy pixel 12 and the dummy signal line 32. Meanwhile, the shortest distance L2 between the charge-voltage converter of the dummy pixel 12 and the effective signal line 31 is 4.0 μm, which is equal to the shortest distance between the gate electrode of the amplification transistor 24 of the dummy pixel 12 and the dummy signal line 32. That is to say, the shortest distance L2 is about thirteen times the shortest distance L1.

Figure 8:
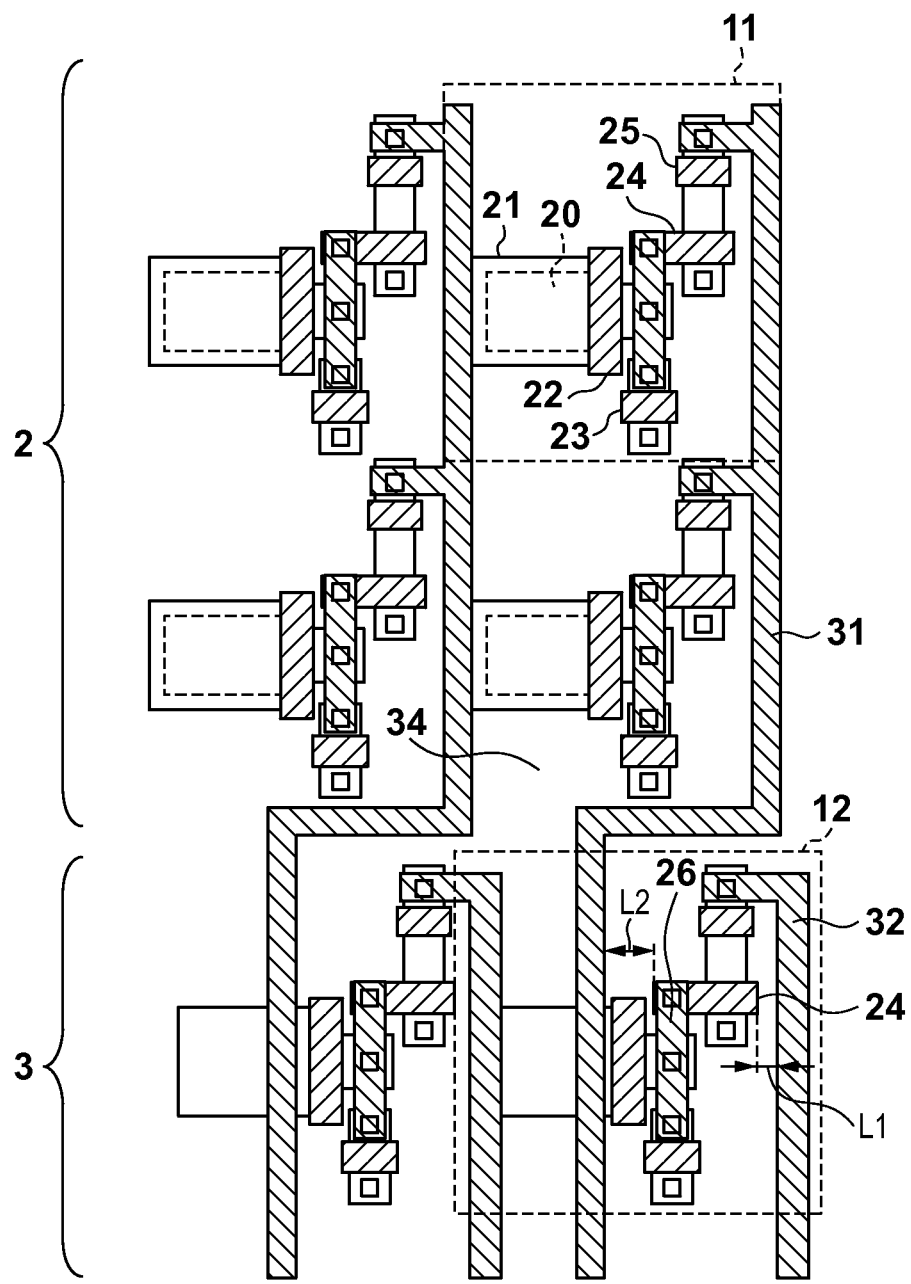
FIG. 8 is a diagram showing a planar layout of a solid-state imaging apparatus according to another example of the present invention.

FIG. 8 is a diagram illustrating a planar layout of the solid-state imaging apparatus 100 according to a second example. The effective pixel 11 and the dummy pixel 12 have equivalent configurations. For example, the effective signal line 31 is arranged on the right of the selection transistor 25 of the effective pixel 11, and similarly, the dummy signal line 32 is arranged on the right of the selection transistor 25 of the dummy pixel 12. The dummy signal line 32 extends straight in the column direction toward the pixel signal processing unit 4.

The effective signal line 31 extends straight in the column direction toward the pixel signal processing unit 4, bends leftward before the dummy pixel 12 (between the pixel array 2 and the dummy pixel unit 3), extends by 9.5 μm, for example, which is equal to a half-pitch, and again extends in the column direction toward the pixel signal processing unit 4. By thus arranging the effective signal line 31 so as to bypass the charge-voltage converter of the dummy pixel 12, the dummy pixel 12 and the pixel row of the effective pixel 11 can be arranged in line. As a result, the effective pixel 11 and the dummy pixel 12 can have characteristics that are more similar to each other than they are in the first example. By causing the effective signal line 31 to bypass the charge-voltage converter of the dummy pixel 12, the shortest distance L1 between the charge-voltage converter of the dummy pixel 12 and the dummy signal line 32 is shorter than the shortest distance L2 between this charge-voltage converter and the effective signal line 31. In the example in FIG. 7, the shortest distance L1 between the charge-voltage converter of the dummy pixel 12 and the dummy signal line 32 is 0.3 μm, which is equal to the shortest distance between the gate electrode of the amplification transistor 24 of the dummy pixel 12 and the dummy signal line 32. Meanwhile, the shortest distance L2 between the charge-voltage converter of the dummy pixel 12 and the effective signal line 31 is 4.0 μm, which is equal to the shortest distance between the gate electrode of the amplification transistor 24 of the dummy pixel 12 and the dummy signal line 32. That is to say, the shortest distance L2 is about thirteen times the shortest distance L1.

Figure 9:
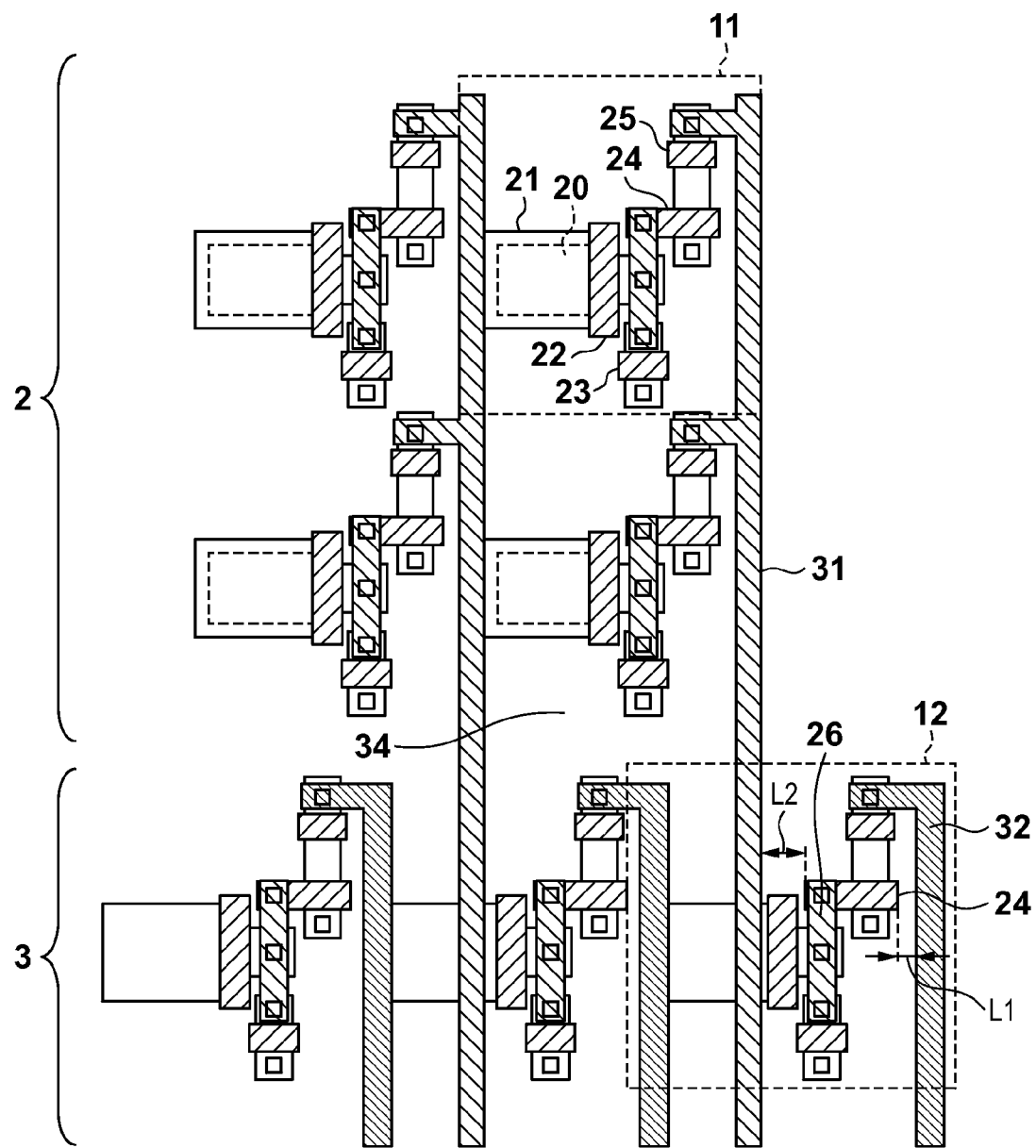
FIG. 9 is a diagram showing a planar layout of a solid-state imaging apparatus according to still another example of the present invention.

FIG. 9 is a diagram illustrating a planar layout of the solid-state imaging apparatus 100 according to a third example. The present example is similar to the first example in terms of the planar layout, but is different in that the effective signal line 31 and the dummy signal line 32 are formed in different wiring layers. A "wiring layer" is a set of electrically conductive patterns formed at the same height or a set of electrically conductive patterns formed in the same process. An insulating layer having a thickness of about 1.6 μm is formed between a wiring layer including the effective signal line 31 and a wiring layer including the dummy signal line 32. As a result, the charge-voltage converter of the dummy pixel 12 can be separated from the effective signal line 31 not only in the horizontal direction but also in the vertical direction, by the shortest distance L2 therebetween, and for example, the shortest distance L2 is about 5.6 μm. That is to say, the shortest distance L2 is about thirteen times the shortest distance L1. Thus, crosstalk between the effective signal line 31 and the dummy pixel 12 can be reduced further than in the first example. In the second example as well, the effective signal line 31 and the dummy signal line 32 can be formed in different wiring layers as in the third example.

Figure 10:
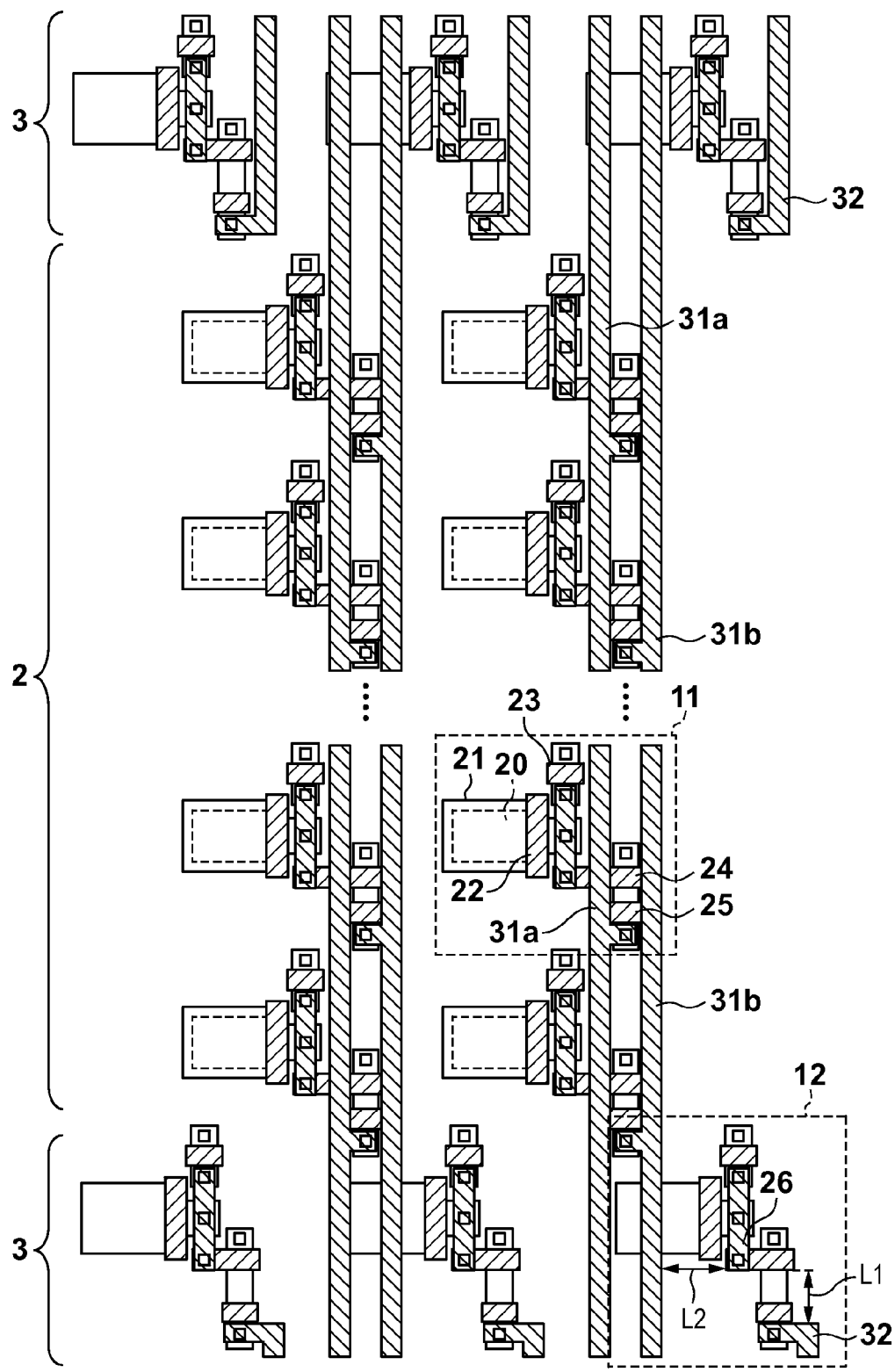
FIG. 10 is a diagram showing a planar layout of a solid-state imaging apparatus according to still another example of the present invention.

FIG. 10 is a diagram illustrating a planar layout of the solid-state imaging apparatus 100 according to a fourth example. In this example, a configuration is employed in which dummy pixel units 3 are arranged on two opposite sides of the pixel array 2, and the pixel array 2 is sandwiched by the two dummy pixel units 3. Pixel signal processing units 4 and horizontal scanning circuits 5, which are not shown in the drawings, are arranged for the respective dummy pixel units 3, on the sides opposite to the pixel array 2. Two effective signal lines 31a and 31b are arranged in one pixel column of the pixel array 2, and for example, the effective pixels 11 located in the odd-numbered rows are connected to the effective signal line 31a, and the effective pixels 11 located in the even-numbered rows are connected to the effective signal line 31b. The effective signal line 31a is connected to the pixel signal processing unit 4 arranged above the pixel array 2, and the effective signal line 31b is connected to the pixel signal processing unit 4 arranged below the pixel array 2. With this configuration, an increase in the speed by multi-wire readout is realized.

Each dummy pixel 12 arranged above the pixel array 2 has a configuration that is similarly equivalent to each effective pixel 11 in the even-numbered rows, and each dummy pixel 12 arranged below the pixel array 2 has a configuration that is similarly equivalent to each effective pixel 11 in the odd-numbered rows. In the present example, the layout of the dummy pixel 12 may have any of the configurations in the above-described first to third examples. In FIG. 10, as in the first example, the dummy pixel 12 is arranged so as to be shifted from the pixel column of the effective pixels 11 by 9.5 μm, which is equal to a half-pitch. With this configuration, the shortest distance L1 between the charge-voltage converter of the dummy pixel 12 and the dummy signal line 32 is shorter than the shortest distance L2 between this charge-voltage converter and the effective signal lines 31a and 31b. In the example in FIG. 10, the shortest distance L2 between the charge-voltage converter of the dummy pixel 12 and the effective signal lines 31a and 31b is 3.0 μm, which is equal to the shortest distance between the gate electrode of the amplification transistor 24 of the dummy pixel 12 and the dummy signal line 32b.

The following is an exemplary description of a camera serving as an exemplary application of this solid-state imaging apparatus in which the solid-state imaging apparatus according to the above-described embodiment is incorporated. The concept of a "camera" includes a device used mainly for shooting, as well as a device that is supplementarily provided with a shooting function (e.g., a personal computer, a mobile terminal, etc.). The camera includes the solid-state imaging apparatus according to the present invention that was described as an example in the above embodiment, and a signal processing unit for processing a signal that is output from this solid-state imaging apparatus. The signal processing unit may include, for example, an A/D converter and a processor for processing digital data that is output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-203537, filed Sep. 14, 2012, and No. 2013-101712, filed May 13, 2013, which are hereby incorporated by reference herein in their entirety.

What is claimed is:

1. A solid-state imaging apparatus, comprising:
a pixel array having a plurality of effective pixels arranged in an array;
an effective signal line to which a signal of a plurality of effective pixels aligned in a first direction is output;
a dummy pixel provided with respect to the plurality of effective pixels aligned in the first direction;
a dummy signal line to which a signal of the dummy pixel is output; and
a processing unit configured to correct the signal from the effective signal line, based on the signal from the dummy signal line,
wherein the effective pixels include a photoelectric converter, a charge-voltage converter configured to convert a charge generated in the photoelectric converter into voltage, and an output unit configured to output a signal corresponding to the voltage of the charge-voltage converter, to the effective signal line,
the dummy pixel includes a charge-voltage converter that has the same configuration as the charge-voltage converter of the effective pixel, and an output unit configured to output a signal corresponding to voltage of the charge-voltage converter of the dummy pixel, to the dummy signal line, and
a shortest distance between the charge-voltage converter of the dummy pixel and the effective signal line is longer than a shortest distance between the charge-voltage converter of the dummy pixel and the dummy signal line.

2. The apparatus according to claim 1,
wherein the charge-voltage converter of the dummy pixel includes a floating diffusion and a conductor electrically connected to the floating diffusion.

3. The apparatus according to claim 2,
wherein the output unit of the dummy pixel includes an amplification transistor having a gate electrode electrically connected to the floating diffusion, and
the conductor electrically connected to the floating diffusion includes the gate electrode of the amplification transistor.

4. The apparatus according to claim 3,
wherein the dummy pixel further includes a reset transistor configured to reset the floating diffusion, and
the conductor electrically connected to the floating diffusion includes an electrode of the reset transistor electrically connected to the floating diffusion.

5. The apparatus according to claim 4,
wherein the floating diffusion, the gate electrode of the amplification transistor, and the electrode of the reset transistor are connected by an electrically conductive pattern and a plug, and
the conductor electrically connected to the floating diffusion includes the electrically conductive pattern and the plug.

6. The apparatus according to claim 1,
wherein the dummy pixel is arranged so as to be shifted in a second direction that is different from the first direction, from the effective pixels aligned in the first direction.

7. The apparatus according to claim 1,
wherein the effective signal line bypasses the charge-voltage converter of the dummy pixel so as not to pass above the charge-voltage converter of the dummy pixel.

8. The apparatus according to claim 1,
wherein the effective signal line and the dummy signal line are included in different wiring layers.

9. The apparatus according to claim 1,
wherein a dummy pixel for a portion of the effective pixels aligned in the first direction and a dummy pixel for another portion thereof are arranged on opposite sides relative to the pixel array.

10. The apparatus according to claim 1,
wherein the photoelectric converter of the effective pixels has a first semiconductor region having the same polarity as a signal charge and a second semiconductor region of an opposite conductivity type, and the area of a semiconductor region that is disposed in an active region of the dummy pixel corresponding to an active region in which the photoelectric converter of the effective pixel is disposed and that has the same polarity as the first semiconductor region is smaller than the area of the first semiconductor region.

11. The apparatus according to claim 1,
wherein the photoelectric converter in the effective pixels has a first semiconductor region having the same polarity as a signal charge and a second semiconductor region of an opposite conductivity type, and a semiconductor region having the same polarity as the first semiconductor region is not provided in an active region of the dummy pixel corresponding to an active region in which the photoelectric converter of the effective pixel is disposed.

12. The apparatus according to claim 11,
wherein the photoelectric converter of the effective pixels further has a third semiconductor region of the opposite conductivity type above the first semiconductor region, and the dummy pixel does not have a region corresponding to the third semiconductor region.

13. A solid-state imaging apparatus comprising:
a pixel array having a plurality of effective pixels arranged in an array;
an effective signal line to which a signal of a plurality of effective pixels aligned in a first direction is output;
a dummy pixel provided with respect to the plurality of effective pixels aligned in the first direction;
a dummy signal line to which a signal of the dummy pixel is output; and
a processing unit configured to correct the signal from the effective signal line, based on the signal from the dummy signal line,
wherein the effective pixels include a photoelectric converter, a charge-voltage converter configured to convert a charge generated in the photoelectric converter into voltage, and an output unit configured to output a signal corresponding to the voltage of the charge-voltage converter, to the effective signal line, the dummy pixel includes a charge-voltage converter and an output unit configured to output a signal corresponding to voltage of the charge-voltage converter of the dummy pixel, to the dummy signal line, the charge-voltage converter of the dummy pixel includes a floating diffusion and a conductor electrically connected to the floating diffusion, and a shortest distance between the charge-voltage converter of the dummy pixel and the effective signal line is longer than a shortest distance between the charge-voltage converter of the dummy pixel and the dummy signal line.

14. The apparatus according to claim 13, wherein the output unit of the dummy pixel includes an amplification transistor having a gate electrode electrically connected to the floating diffusion, and the conductor electrically connected to the floating diffusion includes the gate electrode of the amplification transistor.

15. The apparatus according to claim 14, wherein the dummy pixel further includes a reset transistor configured to reset the floating diffusion, and the conductor electrically connected to the floating diffusion includes an electrode of the reset transistor electrically connected to the floating diffusion.

16. The apparatus according to claim 15, wherein the floating diffusion, the gate electrode of the amplification transistor, and the electrode of the reset transistor are connected by an electrically conductive pattern and a plug, and the conductor electrically connected to the floating diffusion includes the electrically conductive pattern and the plug.

17. A camera comprising:

the solid-state imaging apparatus according to claim 1; and a signal processing unit configured to process a signal obtained by the solid-state imaging apparatus.

18. A camera comprising:

the solid-state imaging apparatus according to claim 13; and a signal processing unit configured to process a signal obtained by the solid-state imaging apparatus.

* * * * *